USOO6075287A

United States Patent [19]
Ingraham et al.

[11] Patent Number: 6,075,287
[45] Date of Patent: Jun. 13, 2000

[54] INTEGRATED, MULTI-CHIP, THERMALLY CONDUCTIVE PACKAGING DEVICE AND METHODOLOGY

[75] Inventors: Anthony P. Ingraham; Glenn L. Kehley, both of Endicott; Sanjeev B. Sathe, Johnson City; John R. Slack, Vestal, all of N.Y.

[73] Assignee: International Business Machines Corporation, Armonk, N.Y.

[21] Appl. No.: 08/826,572

[22] Filed: Apr. 3, 1997

[51] Int. Cl.⁷ .................................................. H01L 23/02
[52] U.S. Cl. .......................... 257/706; 257/686; 257/712; 257/717; 257/723; 257/725
[58] Field of Search ................................... 257/686, 717, 257/723, 725, 712, 706

[56] References Cited

U.S. PATENT DOCUMENTS

| 4,689,721 | 8/1987 | Damerow et al. | 257/686 |
|---|---|---|---|
| 4,774,632 | 9/1988 | Neugebauer | 257/686 |
| 4,914,259 | 4/1990 | Kobayashi et al. | 29/852 |
| 4,956,695 | 9/1990 | Robinson et al. | 257/686 |
| 5,050,039 | 9/1991 | Edfors | 257/686 |
| 5,051,865 | 9/1991 | Kato | 257/686 |
| 5,231,751 | 8/1993 | Sachdev et al. | 29/852 |
| 5,255,738 | 10/1993 | Przilas | 257/712 |
| 5,278,724 | 1/1994 | Angulas et al. | 257/712 |
| 5,281,852 | 1/1994 | Normington | 257/686 |
| 5,289,337 | 2/1994 | Aghazadeh et al. | 257/712 |
| 5,327,327 | 7/1994 | Frew et al. | 257/686 |
| 5,343,075 | 8/1994 | Nishino | 257/686 |
| 5,377,077 | 12/1994 | Burns | 257/686 |
| 5,386,341 | 1/1995 | Olson et al. | 257/686 |
| 5,394,300 | 2/1995 | Yoshimura | 257/686 |
| 5,396,403 | 3/1995 | Patel | 257/712 |
| 5,397,917 | 3/1995 | Ommen et al. | 257/712 |
| 5,426,566 | 6/1995 | Beilstein, Jr. et al. | 257/686 |
| 5,471,366 | 11/1995 | Ozawa | 257/712 |
| 5,473,511 | 12/1995 | Reddy et al. | 257/712 |
| 5,491,612 | 2/1996 | Nicewarner, Jr. | 257/686 |
| 5,552,633 | 9/1996 | Sharma | 257/686 |
| 5,604,377 | 2/1997 | Palagonia | 257/686 |
| 5,726,492 | 3/1998 | Suzuki et al. | 257/723 |

*Primary Examiner*—Donald L. Monin, Jr.
*Assistant Examiner*—Michael Dietrich
*Attorney, Agent, or Firm*—Whitham, Curtis & Whitham; John R. Pivnichny

[57] ABSTRACT

Electrically conductive lamina are attached by an electrically insulating, thermally conductive adhesive and/or solder to one or more semiconductor devices such as chips and extend beyond the periphery of the chip or chips to form heat sink fins. Electrical connections may be made between such chips through holes (e.g. by a wire or plated through hole) in the electrically conductive lamina lined with an insulating material such as the electrically insulating adhesive to provide a structurally robust assembly. Surface pads and connections may overlie patterns of insulator on the lamina. A further lamina can be wrapped around lateral sides of the assembly to provide further heat sink area and mechanical protection for other heat sink fins. A graphite/carbon fiber composite matrix material is preferred for the lamina and the coefficient of thermal expansion of such materials may be matched to that of the semiconductor material attached thereto. Conductivity of the lamina also provides shielding against electrical noise to improve the noise immunity of short connections between chips made through the lamina as well as that of surface connections which may be formed on the lamina.

30 Claims, 2 Drawing Sheets

INTEGRATED, MULTI-CHIP, THERMALLY CONDUCTIVE PACKAGING DEVICE AND METHODOLOGY

BACKGROUND OF THE INVENTION

1. Field of the Invention

The present invention generally relates to packaging of semiconductor devices formed on multiple chips and, more particularly, to the manufacture of a modular device with plural semiconductor chips including high power devices and/or high performance, high-density processors, memories, application specific integrated circuits (ASICS) and logic devices.

2. Description of the Prior Art

It has long been recognized that reduction of size of circuit elements and reduction of spacing and length of connections therebetween in integrated circuits and electronic packages containing one or more integrated circuit chips provides both economies of manufacture and performance improvements. Reduced size of circuit elements generally provides reduced parasitic capacitance and inductance and improved switching speed. Closer spacing of circuit elements on chips, especially in combination with reduced circuit element size, provides potentially increased functionality of each chip while allowing processing costs, which are generally fixed on a "per-wafer" basis, to be spread over an increased number of chips. Reduced connection length reduces signal propagation time and susceptibility to noise.

However, as is well-known, power dissipation from transistors is at a maximum during switching (and, ideally, zero when a transistor is fully turned on or off). Increased switching speed is generally exploited to improve performance by reducing switching cycle time so that the switching interval is maintained at about the same percentage of cycle time as cycle time is reduced. Therefore, heat dissipation per element increases with reduction in cycle time and further increases per unit chip area as integration density increases. Higher operating temperatures can only be utilized to a limited degree in increasing heat dissipation since semiconductor devices will degrade in performance or be destroyed if temperature limits are exceeded.

Thus, for high-performance digital switching circuits (and, of course, analog and power circuits, as well) heat dissipation is a limitation on performance and, as a practical matter, on integration density, forcing a trade-off between manufacturing costs and potential performance while limiting improvements in both. For that reason, where high performance is required and of paramount importance, sophisticated cooling systems including circulation of liquids or cooled gases have often been employed. Such cooling systems are, themselves, very expensive in terms of both manufacturing costs and integration with complex and compact electronic systems, limiting miniaturization and imposing at least two additional failure modes.

Specifically, such cooling systems are generally of a geometry and configuration which displaces or prevents the significant utilization of convection or radiant heat transfer and, of course, are subject to malfunction which would allow temperature limits to be exceeded very quickly. Further, the actual heat required to be dissipated depends of the actual number of switching transitions which occur.

Further, while average numbers of switching cycles at a given cycle time may be statistically projected, the number is subject to wide variation, particularly with high-performance so-called dynamic logic circuits which (as distinct from dynamic memories which are periodically refreshed) are precharged to particular logic state prior to each switching cycle and thus switch only as required. Therefore, cooling systems which rely on a large temperature differential between chips and coolant fluid for efficiency may cause wide temperature excursions and thermal cycling of chips which may also degrade the structures therein (e.g. by metal fatigue or migration and internal semiconductor stresses which may be relieved by formation of crystal dislocations that may thereafter trap charge, cause leakage, etc.). Thus, the importance of the nature of packaging of integrated circuits to utilize naturally occurring heat transfer mechanisms such as convection or highly reliable forced air cooling at ambient temperature, where possible, is of great importance to performance, reliability and economy of manufacture of electronic devices which may contain integrated circuit packages.

In this regard, the "footprint" of electronic circuit packages on a substrate to which the circuit package may be attached is also of importance to complete device performance in the same manner as small circuit element size and short connection length provides performance advantages on individual chips and within integrated circuit packages. Similarly, when fine patterns of electrical conductors are formed at close spacing on such a substrate, manufacturing yield generally decreases with increase of substrate area.

To minimize connection length and minimize the area occupied by an integrated circuit package, it is known to stack chips parallel to a substrate on which the package is to be mounted or to mount the chips vertically (e.g. orthogonal to the substrate), making connections along the edges of the chips. However, increased density of package mounting is subject to the same problems of heat dissipation at the level of the substrate area as discussed above in connection with chip area. Further, vertical mounting of chips generally provides less support and structural robustness of the chip mounting structure. Thus savings in area to provide increased proximity of packages can be easily defeated by the requirement for large heat sinks and chip mounting structures which may be required to have a greater area "footprint" on a supporting structure than the integrated circuit chip or package itself.

In this regard, the length of heat conduction through the heat sink, itself, must also be considered in the efficiency of the design thereof together with package mounting density and maximum or even adequate thermal performance is seldom consistent with maximum electrical performance and compactness. Additionally, heat transfer from the edge of a chip is necessarily poor and generally requires conduction of heat through the semiconductor substrate of the chips. Transfer of heat to such a heat sink is also problematical since intimate thermal contact of the chips to the heat sink is usually achieved through the use of a thermally conductive grease which presents two thermal boundaries and is of relatively low thermal conductivity. Use of a thermal paste also presents the problem of confining it to the desired location which may be complicated structurally and, if confinement is not effective, may result in unexpected loss or compromise of the heat transfer function.

Recently, there has been interest in graphite and graphite composite materials, in particular, for conduction of heat, particularly in extremely high temperature environments such as in jet engines and high speed airframes. Some applications to electronics have been suggested, as well, although no admission is made that any such suggestions constitute prior art as to the present invention. These materials have several potential advantages for such applications in that heat conduction, at least in a single plane, can be quite high (e.g. about three times that of copper). Additionally, by appropriate choice of additives and fillers, it is possible to closely match the coefficient of thermal expansion (CTE) of such materials to that of semiconductor substrate materials such as silicon or germanium or any other materials used in packaging so that changes of temperature do not result in significant mechanical stresses in a semiconductor chip to which such materials may be attached.

On the other hand, while copper is thermally conductive isotropically, these graphite and graphite/fiber composite materials generally are anisotropically thermally conductive, exhibiting much lower heat conductivity (e.g. about one-quarter to one-third that of copper or about ten percent or less of the heat conductivity in the preferred heat conduction direction) in other directions. Further, while graphite composite materials are generally much more electrically resistive than copper or other materials commonly used for conductors in electronics packages (e.g. $10x$–$100x$), they are far too conductive to be considered insulators. As is generally known, materials which exhibit good thermal conductivity also exhibit good electrical conductivity and vice-versa. Conversely, electrically insulative materials can generally be expected to exhibit poor thermal conductivity.

Accordingly, while electrically conductive materials may be used for relatively large structures, such as making thermal connections from heat sources to heat sinks of potentially substantial length (e.g. having a total thermal resistance comparable to any insulator placed in the thermal path) as has been known for the so-called "heat-pipe", it is not clear that they are usable in chip-level electronic packaging or that, even if so usable, they would provide any advantage in chip packaging density at either the package or substrate level or support any gain in electrical performance by overall reduction of connection length.

Accordingly, it is seen that there is a need for an overall solution to the concurrent problems of integration density, packaging compactness, structural robustness of packaging, package mounting area and density and heat transfer from chips to a heat sink structure having a high efficiency of heat dissipation through simple heat transfer mechanisms, such as convection.

SUMMARY OF THE INVENTION

It is therefore an object of the present invention to provide a method and structure for the packaging of integrated digital, analog and power circuits having an integral heat sink of high efficiency.

It is another object of the invention to provide a method and structure for packaging of integrated circuit chips of improved compactness and shortness of connections between chips for high electrical performance and noise immunity consistent with high efficiency of heat dissipation.

In order to accomplish these and other objects of the invention, an electronic device is provided including an electrically and thermally conductive lamina, and a semiconductor device attached to the conductive lamina. The electrically and thermally conductive lamina extends beyond a periphery of the semiconductor device to form a heat sink fin and includes an electrical insulator to prevent electrical contact between the conductive lamina and an electrical connection to the semiconductor device while mechanically supporting the electrical connection to the semiconductor device. The conductivity of the lamina also provides electrical shielding for the electrical connection.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
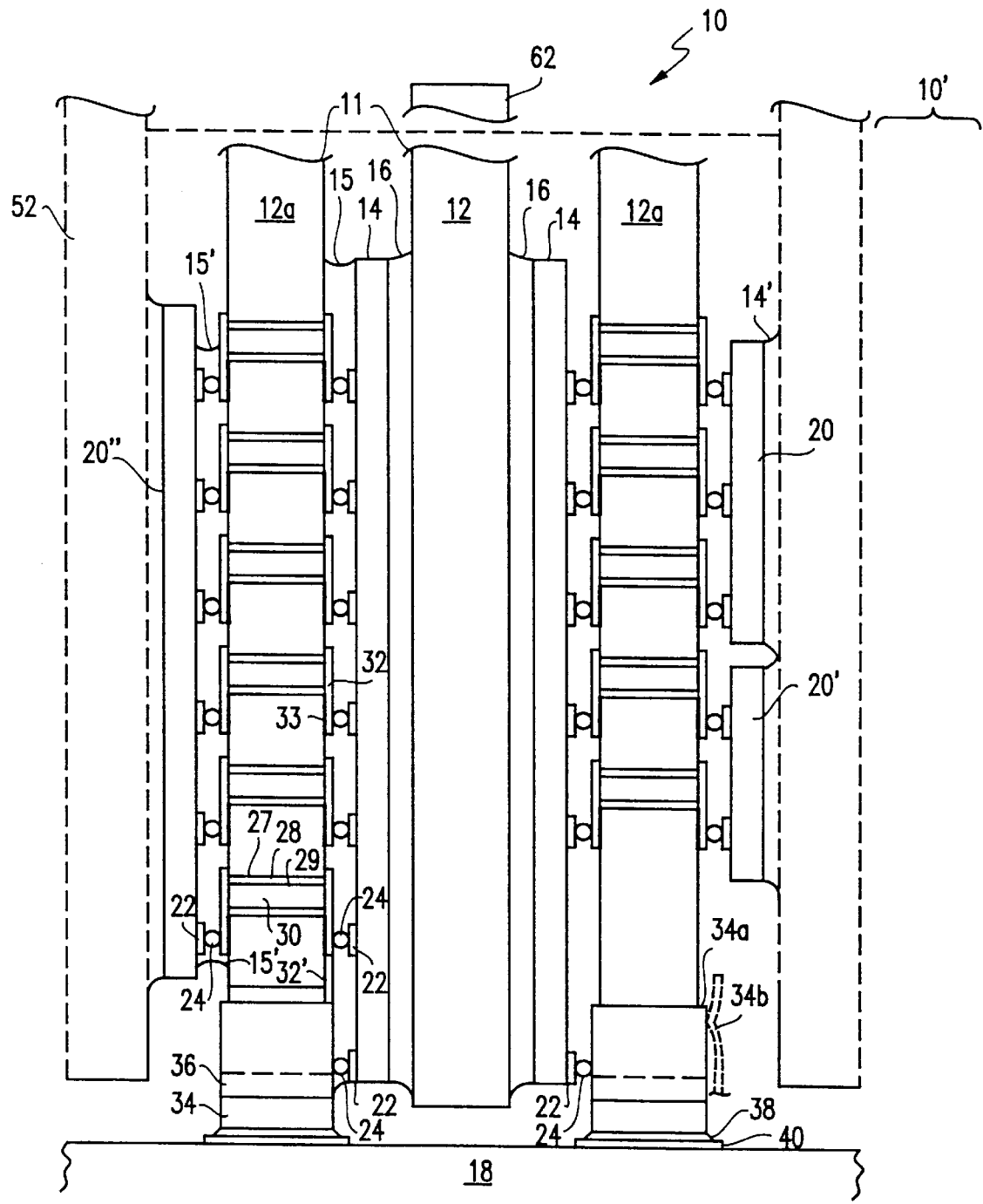
FIG. 1 is a cross-sectional view of an integrated circuit package in accordance with the invention.

Referring now to the drawings, and more particularly to FIG. 1, there is shown, in cross-section, a preferred packaging structure 10 in accordance with the present invention. In this exemplary form of the invention illustrated in FIG. 1, three heat sink lamina 12, 12a, preferably formed of a graphite composite material or fiber/graphite matrix are shown. Other conductive materials of high thermal conductivity such as metals (e.g. copper, silver, aluminum, etc.), chemical vapor deposited (CVD) diamond, aluminum nitride, copper beryllium alloys or copper aluminum nitride alloys can be used in the practice of the invention as well.

In this particular case, heat sink lamina 12a provides through connections 30 between major surfaces thereof made in a manner which will be discussed in greater detail below while lamina 12, as illustrated, does not. It should be understood that, as package and circuit designs may dictate, through connections 30 may be included in any or all such lamina 12, 12a. It should be noted further that, as illustrated, the extent of lamina 12, 12a beyond the periphery of chip 14 to form a heat sink fin can be as great as needed for adequate heat dissipation both in the direction indicated by the curved cut lines 11 and to the front and back of the page containing FIG. 1, as well. Of course, the dimension or "footprint" of the package in the plane of substrate 18 to which it is attached will be determined by the extent of the heat sink lamina toward the front and back of the page and these dimensions should be generally minimized or other expedients employed as will be discussed with reference to FIG. 3, below.

Integrated circuits 14 are attached to heat sink lamina 12 with, for example (since electrical connections are, in this case, not necessary), a thermally conductive but electrically insulative epoxy 16. A preferred adhesive is commercially available under the designation TRA-BOND 2151, available from TRA-CON, Inc., 55 North Street, Medford, Mass. 02155, although numerous other materials are known and suitable for the purpose.

In this case, chips 14 have surface metallization 22 for surface connections and/or contact pads. Similar metallization can be formed on the opposite sides of the chip if required or desired and will be protected from shorting by the heat sink lamina 12 by the insulating adhesive 16 while intimate thermal contact will be provided to assure good heat transfer from chip 14 to heat sink lamina 12. Additional heat transfer from chips 14 to heat sink lamina 12a is accomplished through the metal solder electrical connections 24, radiant energy transfer and possibly an electrically insulating thermal grease held in place, for example, by capillary action as indicated by meniscus 15 or further heat conductive but electrically insulative adhesive injected between the chip 14 and heat sink lamina 12a around the connections. Of course, if electrical connections need not be made other than at the edge of the chip 14, a further heat sink lamina can simply be attached to chip 14 by a thermally conductive adhesive as described above.

However, it is usually the case that the major surface on at least one side of the chip will be required to form an adequate number of connections to support the level of functionality of the chip which may be available at the present state of the art. Furthermore, it may be necessary to form connections to a similar plurality of contacts on another chip with connections which are as short as possible such as in making connections to a memory structure such as a dynamic random access memory (DRAM) such as is indicated at 20" or one or more cache memories 20, 20'.

Figure 2:
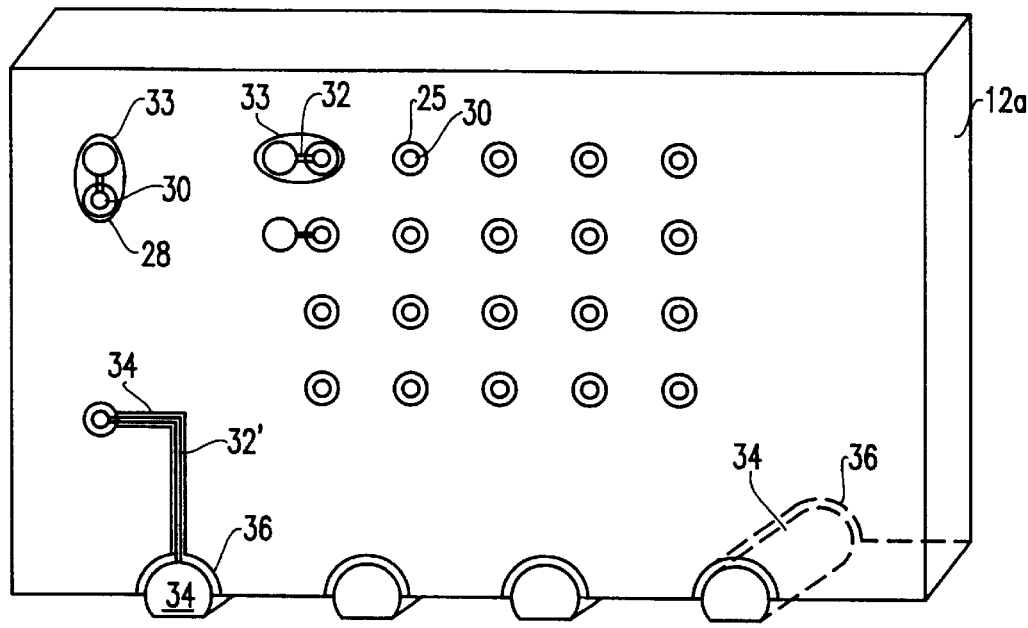
FIG. 2 is a perspective view of a heat sink connection lamina structure of FIG. 1.

To form such connections through as short a length of conductive material as possible, it is preferred, in accordance with the invention, to provide connections 30 through heat sink lamina 12a which has been referred to above as a heat sink connection lamina structure, shown in plan view in FIG. 2. In order to do so, holes 27 are formed by any suitable method such as drilling, punching, laser ablation or the like; drilling being preferred at the present time. Since heat sink connection lamina 12a is effectively conductive electrically, an insulative coating or paste, preferably of an adhesive such as that used for adhesive attachment 16 is applied to the conductive lamina, preferably by screening, and further holes 29 formed therethrough by similar processes. However, other materials such as polyimide (which, conveniently, may be of a photosensitive type for patterning), ceramics, silicones and plastics can also be used and applied in a liquid or solid (e.g. insert or sheet) form by any suitable method (e.g. adhesively or press-fitting).

If screening techniques are used in formation of insulator 28 and connections 30, insulative layer 33 can be formed where needed using the same materials concurrently with filling of holes 27 and conductive connection pads 32, if provided, may be concurrently formed with filling of holes 29. However, it is preferred at the present time, to use a screening process for the insulating adhesive to fill holes 27 and to insert a solid wire 30 through the insulating paste or adhesive 28 prior to its drying or cure and thus avoid separate formation of holes 29. The ends of the wire 30 can be machined or cut flush with the heat sink lamina surface and pads 32 can then be applied, if desired, over insulator 33 by screening, electroless plating or any other suitable process. It may be desirable in some applications, however, to form insulator layers 33 in a separate process from the filling of holes 27 so that a different insulator material or form thereof can be used, for example in the case of plastic inserts and patternable sheet, mentioned above.

Holes 29 can also be filled by screening with a conductive paste or plated through (and filled, if desired) by electroless plating. If not filled by plating, filling with a conductive or non-conductive material is desirable to increase structural robustness of the plated through holes (PTH). In either case, connections 30 will be formed through the thickness of the heat sink connection lamina structure 12a.

It should be understood that connection pads 32 (insulated by layer 33 from lamina 12a) are not necessary to the practice of the invention but are preferred to increase registration tolerances as the heat sink connection lamina structure is connected to chips 14 and 20, 20', 20". So-called C4 solder preforms 24 which are widely used in the art are a preferred method of making chip connections to connectors 30. Mechanical robustness of the solder connections can be enhanced by application (e.g. injection) of a suitable encapsulant material as indicated at 15'.

Figure 3:
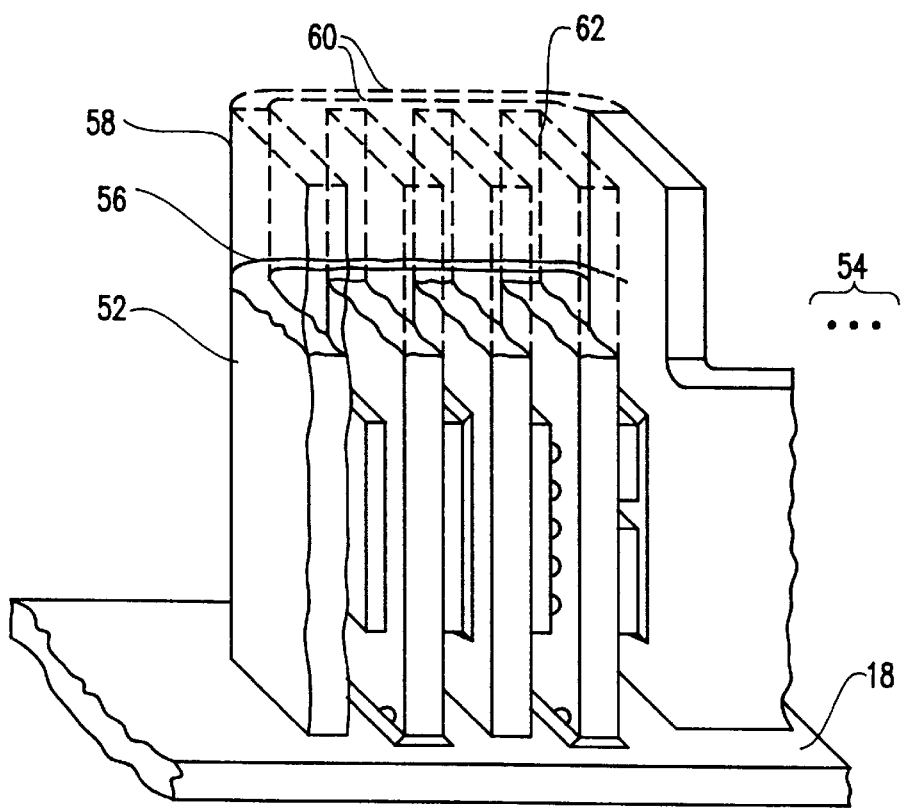
FIG. 3 is a partially cut-away perspective view of a completed integrated circuit package including, for example, a processor and memory chips in accordance with a preferred application of the principles of the invention.

However the through connections 30 are formed, it is an important feature of the invention that they can be limited to the thickness of the heat sink lamina and the length of any further surface connection 32, 32' formed and thus exhibit extremely short propagation time and noise immunity as well as being fully supported mechanically. Additionally, the conductivity of even graphite/fiber composite matrix materials is sufficient that some electrical shielding of these connections is also provided. The resulting structure as shown in FIG. 1 or 3 is structurally robust to provide secure mounting for the chips and reliable connections between them and thermally stable if the CTE of the chips and the heat sink material is reasonably well-matched, The resilience of the graphite/fiber composite matrix material provides significant damping of vibrations which may reach the chips and substantial protection of the heat sink "fins" formed by the respective heat sink lamina from deformation during handling or post-installation accelerations and forces which might adversely affect heat transfer efficiency by simple mechanisms such as convection or forced air flow.

In this regard, any desired surface connections can be made on the heat sink connection lamina structure 12a by screening or other suitable techniques. Such connections will generally be desired at a mounting edge as indicated at 32'. As shown in FIG. 2, this connection is made to a mechanically robust connection structure 34, 36 for attachment of the chips to substrate 18 through the heat sink connection lamina 12a. (Heat sink lamina 12 could also be similarly connected if it carries connections which must also be connected to substrate 18.)

While these structurally robust connections 34 could be formed in numerous ways which will be apparent to those skilled in the art, a preferred form for such connections is similar to that for forming the through connections 28, 30 but preferably on a slightly larger scale. Specifically, a hole is drilled or a semi-circular opening or recess is machined into the edge of the lamina which is then filled or lined with insulating paste or adhesive 36 and a body of electrically conductive material such as wire 34 inserted therethrough. A flat side can be formed on wire 34 prior or subsequent to such insertion. After drying or curing of the adhesive, the edge of heat sink connection lamina structure 12a and/or wires 34 is ground until wires 34 are exposed and, preferably, a flat side formed thereon, (if not previously done) as shown in FIG. 2. This grinding process will usually recess the edge of the lamina 12a, if of a softer material, behind the flat surface formed on the wires 34 (again, if not previously so formed). The heat sink lamina 12, 12a together with chips 14, 20, 20', 20" can then be attached, as a package, to metallization 40 on substrate 18 by, for example, solder 38 or other suitable materials such as an electrically conductive adhesive.

Alternatively, the flattened ends of the conductive body generally parallel to the major surfaces of lamina 12a and generally orthogonal to the edge of lamina 12a can be formed to engage a socket with a wiping contact as the lamina is inserted therein. In such a case, it is desirable that a flattenned end of the electrically conductive body 34 extend beyond a surface of the lamina as shown at 34a to prevent the corresponding contact(s), illustrated by dashed lines 34b, within the socket from contacting the surface of lamina 12a.

Referring now to FIG. 2, heat sink connection lamina 12a is shown in a perspective view. As discussed above, a matrix of through connections 30 enclosed in insulative adhesive or paste 28 is provided for attachment of one or more chips or other electronic components. Where pads (here illustrated in a so-called "dog-bone" configuration) 32 or surface connections 32' are formed, insulating layer patterns 33 are also provided to prevent contact of the pads or surface connections with the heat sink lamina.

Referring now to FIG. 3, a perfecting feature of the invention will now be discussed. Graphite/fiber matrix materials need not be in merely planar configurations and can be formed in any desired shape. For example, in addition to the structure discussed above in regard to FIG. 1, further conductive heat sink material/lamina 52 can be attached to chips 20, 20', 20" with heat conductive adhesive or solder or any combination of the heat transfer arrangements described above as generically depicted at 14' of FIG. 1. Other chips of packages containing multiple chips as described above and indicated in FIG. 1 by partial bracket 10' could be further attached to the structure (with or without electrical connections through lamina 52) to form larger, more complex packages, as schematically indicated by dots 54 in FIG. 3.

If it is desired to increase package size in this manner, for example, to derive increased compactness as well as improved temperature uniformity throughout the larger package, it is considered preferable to form heat sink lamina in a serpentine configuration wrapping around a lateral side of the chips and heat sink lamina structure to increase conduction cross-section of the lamina (e.g. in a direction away from substrate 18) without significant increase in bulk of the device. Such a configuration can include upstanding fins 58 by terminating the vertical extent of the lamina at 56, as might be appropriate where forced air cooling was contemplated, or the vertical extent of the serpentine lamina could be carried to a height indicated by dashed lines 60 which would provide additional structural protection for heat sink lamina fins 62 of heat sink lamina 12, 12' as well as increased area for heat transfer by convection and radiation. In this latter case, in particular, it should be understood that heat sink material 52 would provide increased structural robustness of the package as well as improved thermal performance and protection of heat sink fins 62 formed on lamina 12, 12' even without the formation of a larger, more complex electronic package than is illustrated in FIG. 1.

In view of the foregoing, it is seen that the invention provides a technique of incorporating electrically conductive lamina having high heat conductivity into extremely compact multi-chip packages having a small footprint for high mounting density on a substrate with short connection leads as well as forming a mechanically robust package largely free of stresses from thermal cycling and having connections of minimal length for high performance and noise immunity. The electrically conductive material improves noise immunity through shielding of the short electrical conductors between chips and on lamina surfaces. Particularly if formed of graphite/fiber composite matrix materials, extension of the lamina to form fins for heat dissipation through simple, reliable and naturally occurring mechanisms are rigid and resist deformation which might compromise heat transfer performance. Further, mechanical protection for fins can be integrally provided by the package structure such that, for example, malleable materials such as metal could be used for lamina 12, 12a and protected by graphite/fiber composite material used for serpentine structure 52.

While the invention has been described in terms of a single preferred embodiment, those skilled in the art will recognize that the invention can be practiced with modification within the spirit and scope of the appended claims.

Having thus described my invention, what we claim as new and desire to secure by Letters Patent is as follows:

1. An electronic device including
   an electrically and thermally conducting lamina having opposing surfaces and insulated through vias, and
   a semiconductor device mounted to said electrically and thermally conducting lamina, said semiconductor device mounted over said insulated through vias,
   said electrically and thermally conducting lamina extending beyond a periphery of said semiconductor device to form a heat sink fin and including an electrically insulating means extending through said through vias and disposed between opposing surfaces of said electrically and thermally conducting lamina, said electrically insulating means further being disposed on portions of the opposing surfaces of said electrically and thermally conducting lamina and preventing electrical contact between said electrically and thermally conducting lamina and electrical connection means, said electrical connection means extending through said electrically and thermally conducting lamina and contacting a surface of said electrically insulating means disposed on portions of the opposing surfaces, said electrical connection means connecting to said semiconductor device, and
   an edge connection to said electrically and thermally conducting lamina, said edge connection comprising a body of electrically conductive material affixed to recesses in an edge of said electrically and thermally conducting lamina with an insulating adhesive.

2. A device as recited in claim 1, wherein said electrically conducting lamina includes an aperture containing a portion of said insulating means and said connection means to said semiconductor device passes through said aperture.

3. A device as recited in claim 2, wherein said connection means to said semiconductor device is a wire inserted through said insulating means.

4. A device as recited in claim 2, wherein said connection means to said semiconductor device is a plated through hole in said insulating means.

5. A device as recited in claim 1, wherein said connection means to said semiconductor device is a surface connection or pad overlying a portion of said insulating means.

6. A device as recited in claim 1, wherein said insulating means includes a heat conducting, electrically insulating adhesive.

7. A device as recited in claim 3, wherein said insulating means includes a heat conducting, electrically insulating adhesive.

8. A device as recited in claim 4, wherein said insulating means includes a heat conducting, electrically insulating adhesive.

9. A device as recited in claim 5, wherein said insulating means includes a heat conducting, electrically insulating adhesive.

10. A device as recited in claim 2, including
    another semiconductor device,
    wherein said connection means to said semiconductor device is connected to said another semiconductor device.

11. A device as recited in claim 10, further including
    another lamina located around a lateral side of said semiconductor devices and said lamina and attached by further insulating means to said semiconductor device and said another insulating device.

12. A device as recited in claim 1 wherein said electrically and thermally conducting lamina is anisotropically thermally conductive.

13. A device as recited in claim 1, further including to thermally conducting lamina, said edge connection comprising a body of electrically conductive material affixed to recesses in an edge of said electrically and thermally conducting lamina with an insulating adhesive and a surface connection extending over an insulator on a surface of said electrically and thermally conductive lamina.

14. A device as recited in claim 13, wherein said body of electrically conductive material is formed with a flat side generally parallel to said edge of said electrically and thermally conducting lamina.

15. A device as recited in claim 13, wherein said body of electrically conductive material is formed with a flat side generally orthogonal to said edge of said electrically and thermally conducting lamina.

16. A device as recited in claim 15, wherein said body of conductive material extends beyond a surface of said electrically and thermally conducting lamina such that said flat side in raised from said surface.

17. The electronic device of claim 1, wherein said connection means includes contact pads electrically insulated from said opposing surfaces.

18. The electronic device of claim 1, further comprising
a second semiconductor device attached to said electrically and thermally conducting lamina opposing said semiconductor device,
said electrically insulating means preventing electrical contact between said electrically and thermally conducting lamina and said electrical connection means extending through said electrically and thermally conducting lamina and further contacting a surface of said electrically insulating means disposed on portions of the opposing surfaces, said electrical connection connecting to said semiconductor device.

19. A method of packaging a multi-chip electronic device including the steps of
forming apertures in a heat-conductive lamina having an extent larger than a chip of said multi-chip electronic device,
applying an electrically insulating material in said apertures,
applying said electrically insulating material to portions of said heat conductive lamina at locations substantially surrounding said apertures,
forming an electrical connection through said insulating material which does not contact said heat conductive lamina,
further forming said electrical connection on said electrically insulating material at the portions of said heat conductive lamina substantially surrounding said apertures,
connecting a pad of respective chips to said electrical connection which contacts said insulating material at the portions of said heat conductive lamina substantially surrounding said apertures,
forming at least one notched recess in a bottom edge of said heat-conductive lamina,
applying said electrically insulating material within said notched recess said electrically insulating material being disposed between opposing sides of said heat-conductive lamina, and
further forming said electrical connection of said notched recess.

20. A method as recited in claim 19, including the further step of
forming said lamina to surround an edge of a chip connected to said electrical connection.

21. A method as recited in claim 20 including the further step of bonding a chip to said lamina.

22. A method as recited in claim 20 including the further step of
bonding a chip to another lamina having an extent greater than said respective chips and wherein said lamina molded by said molding step surrounds an edge of said another lamina.

23. A method as recited in claim 19, including the further step of
applying an insulating adhesive between said lamina and a chip connected to said electrical connection.

24. A method as recited in claim 19, including the further step of
applying a thermal paste between said lamina and a chip connected to said electrical connection.

25. A method as recited in claim 19, including the further step of providing said aperture at an edge of said lamina.

26. A method as recited in claim 25, including the further step of
forming a flat surface on a side of said electrical connection, said flat surface being exposed at an edge of said lamina.

27. An electronic device including
an electrically and thermally conducting lamina having opposing surfaces and at least one notched recess in a bottom edge of the electrically and thermally conducting lamina, and
at least one semiconductor device attached to said electrically and thermally conducting lamina, said electrically and thermally conducting lamina extending beyond a periphery of said at least one semiconductor device to form a heat sink fin and including electrically insulating means extending within said notched recess and being disposed between the opposing surfaces of said electrically and thermally conducting lamina thereby preventing electrical contact between said electrically and thermally conducting lamina and an electrical connection extending within said notched recess of said electrically and thermally conducting lamina between the opposing surfaces, said electrical connection connecting to said at least one semiconductor device.

28. The electronic device of claim 27, wherein said notched recess is semi-circular shaped.

29. The electronic device of claim 27, wherein said electrically insulating means includes an insulated surface trace connection between said at least one semiconductor and said electrical connection in said recess.

30. The electronic device of claim 29, wherein said connection means further includes electrically conductive traces connecting said contact pads to said semiconductor device on at least one of the opposing surfaces.

* * * * *